United States Patent
Eichelberg

(10) Patent No.: US 10,251,314 B1
(45) Date of Patent: Apr. 2, 2019

(54) DATACENTER AISLE CONTAINMENT STRUCTURE

(71) Applicant: Amazon Technologies, Inc., Seattle, WA (US)

(72) Inventor: John William Eichelberg, Spokane, WA (US)

(73) Assignee: Amazon Technologies, Inc., Reno, NV (US)

( * ) Notice: Subject to any disclaimer, the term of this patent is extended or adjusted under 35 U.S.C. 154(b) by 0 days.

(21) Appl. No.: 15/477,987

(22) Filed: Apr. 3, 2017

Related U.S. Application Data

(63) Continuation of application No. 14/752,424, filed on Jun. 26, 2015, now Pat. No. 9,615,488, which is a continuation of application No. 13/682,550, filed on Nov. 20, 2012, now Pat. No. 9,072,193.

(51) Int. Cl.
| | |
|---|---|
| *H05K 7/20* | (2006.01) |
| *A47B 96/04* | (2006.01) |
| *H05K 7/18* | (2006.01) |
| *A47B 96/14* | (2006.01) |

(52) U.S. Cl.
CPC ......... *H05K 7/20745* (2013.01); *A47B 96/04* (2013.01); *H05K 7/183* (2013.01); *A47B 96/14* (2013.01); *H05K 7/2059* (2013.01)

(58) Field of Classification Search
CPC .............. H05K 7/1488; H05K 7/2059; H05K 7/20745; H05K 7/18–7/186; A47B 96/04; A47B 96/14
See application file for complete search history.

(56) References Cited

U.S. PATENT DOCUMENTS

| | | | |
|---|---|---|---|
| 5,209,356 A * | 5/1993 | Chaffee ................ | A47B 81/064 211/26 |
| 7,782,625 B2 | 8/2010 | Taylor et al. | |
| 7,800,900 B1 | 9/2010 | Noteboom et al. | |
| 8,331,086 B1 | 12/2012 | Meissner et al. | |
| 8,498,114 B2 | 7/2013 | Martini et al. | |
| 8,627,611 B2 | 1/2014 | Cottuli et al. | |
| 8,628,153 B2 | 1/2014 | Hibner et al. | |
| 8,628,154 B2 | 1/2014 | Caveney et al. | |
| 8,628,158 B2 * | 1/2014 | Caveney ........... | H05K 7/20745 312/204 |
| 8,915,286 B2 * | 12/2014 | Zernach ............... | H05K 7/1488 160/31 |
| 9,072,193 B1 * | 6/2015 | Eichelberg .......... | H05K 7/1488 |
| 9,615,488 B1 * | 4/2017 | Eichelberg ............ | H05K 7/183 |

(Continued)

OTHER PUBLICATIONS

U.S. Appl. No. 13/682,550 , "Ex-Parte Quayle Action", dated Dec. 5, 2014, 9 pages.

(Continued)

*Primary Examiner* — Zachary Pape
(74) *Attorney, Agent, or Firm* — Kilpatrick Townsend & Stockton LLP

(57) ABSTRACT

An air containment system for a datacenter. The air containment system includes horizontally slidable vertical rails that engage the rear rails to two adjacent server racks. The vertical rails can include a front face that is compressible to provide an airtight connection with the server racks. Filler plates attach to adjacent vertical rails and fill the space between a top of the server rack and the top of the rails.

20 Claims, 6 Drawing Sheets

(56) References Cited

U.S. PATENT DOCUMENTS

| | | | |
|---|---|---|---|
| 2002/0153338 A1* | 10/2002 | Orr | A47B 47/03 |
| | | | 211/183 |
| 2007/0144993 A1 | 6/2007 | Knoop et al. | |
| 2008/0310126 A1* | 12/2008 | Lakoduk | H05K 7/1425 |
| | | | 361/731 |
| 2010/0144265 A1 | 6/2010 | Bednarcik et al. | |
| 2012/0112612 A1* | 5/2012 | Krietzman | H05K 7/20745 |
| | | | 312/236 |
| 2013/0165035 A1 | 6/2013 | Krietzman et al. | |
| 2013/0276389 A1 | 10/2013 | Marrs et al. | |
| 2013/0300266 A1* | 11/2013 | Ramey | A47B 87/0276 |
| | | | 312/111 |
| 2014/0196394 A1 | 7/2014 | Greeson et al. | |

OTHER PUBLICATIONS

U.S. Appl. No. 13/682,550 , "Notice of Allowance", dated Mar. 5, 2015, 5 pages.

U.S. Appl. No. 14/752,424 , "Non-Final Office Action", dated Aug. 19, 2016, 12 pages.

U.S. Appl. No. 14/752,424 , "Notice of Allowance", dated Nov. 28, 2016, 10 pages.

* cited by examiner

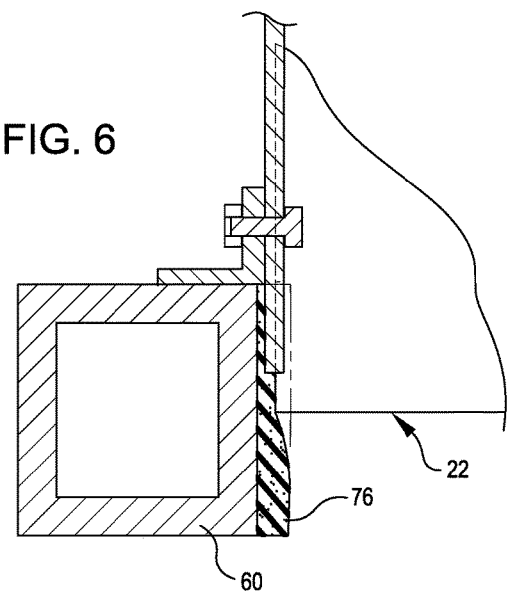
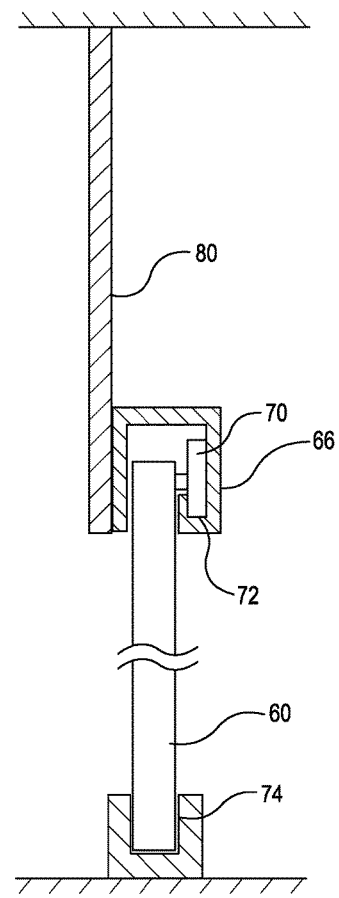

DATACENTER AISLE CONTAINMENT STRUCTURE

CROSS-REFERENCES TO RELATED APPLICATIONS

This application is a Continuation Application of U.S. patent application Ser. No. 14/752,424, filed Jun. 26, 2015, entitled "DATACENTER AISLE CONTAINMENT STRUCTURE", issued as U.S. Pat. No. 9,615,488 on Apr. 4, 2017, which is a continuation of U.S. patent application Ser. No. 13/682,550, filed Nov. 20, 2012, entitled "DATACENTER AISLE CONTAINMENT STRUCTURE", issued as U.S. Pat. No. 9,072,193 on Jun. 30, 2015, the contents of which are incorporated herein by reference in their entirety.

BACKGROUND

A datacenter is a facility used to house a collection of computer servers and associated components, typically network hardware. The collection of computer servers is often called a "server cluster" or "server farm," and is designed to accomplish server needs far beyond the capability of a single machine. The networking hardware typically includes network switches and/or routers which enable communication between the different parts of the server farm and the users of the server farm.

Server farms are commonly used for cluster computing, web services, remote data storage, web hosting, and other web services. Server farms are increasingly being used by enterprises instead of, or in addition to, mainframe computers. As the demand for server farms continues to increase, a need exists to limit the cost of operating a datacenter. Often, a large part of the cost of operating a datacenter is related to the datacenter's cooling systems and the total electricity cost. To this end, enterprises typically try to maximize power usage effectiveness (PUE) of a datacenter, which is a measure of how efficiently a computer datacenter uses its power; specifically, how much of the power is actually used by the computing equipment in contrast to cooling and other overhead.

BRIEF DESCRIPTION OF THE DRAWINGS

Various embodiments in accordance with the present disclosure will be described with reference to the drawings, in which:

FIG. 6 is a cutaway view showing contact of a real rail of a server with a vertical rail for the aisle containment system of FIG. 4; and FIG. 7 is a cutaway view of a top rail for the aisle containment system of FIG. 4.

DETAILED DESCRIPTION

Figure 1:
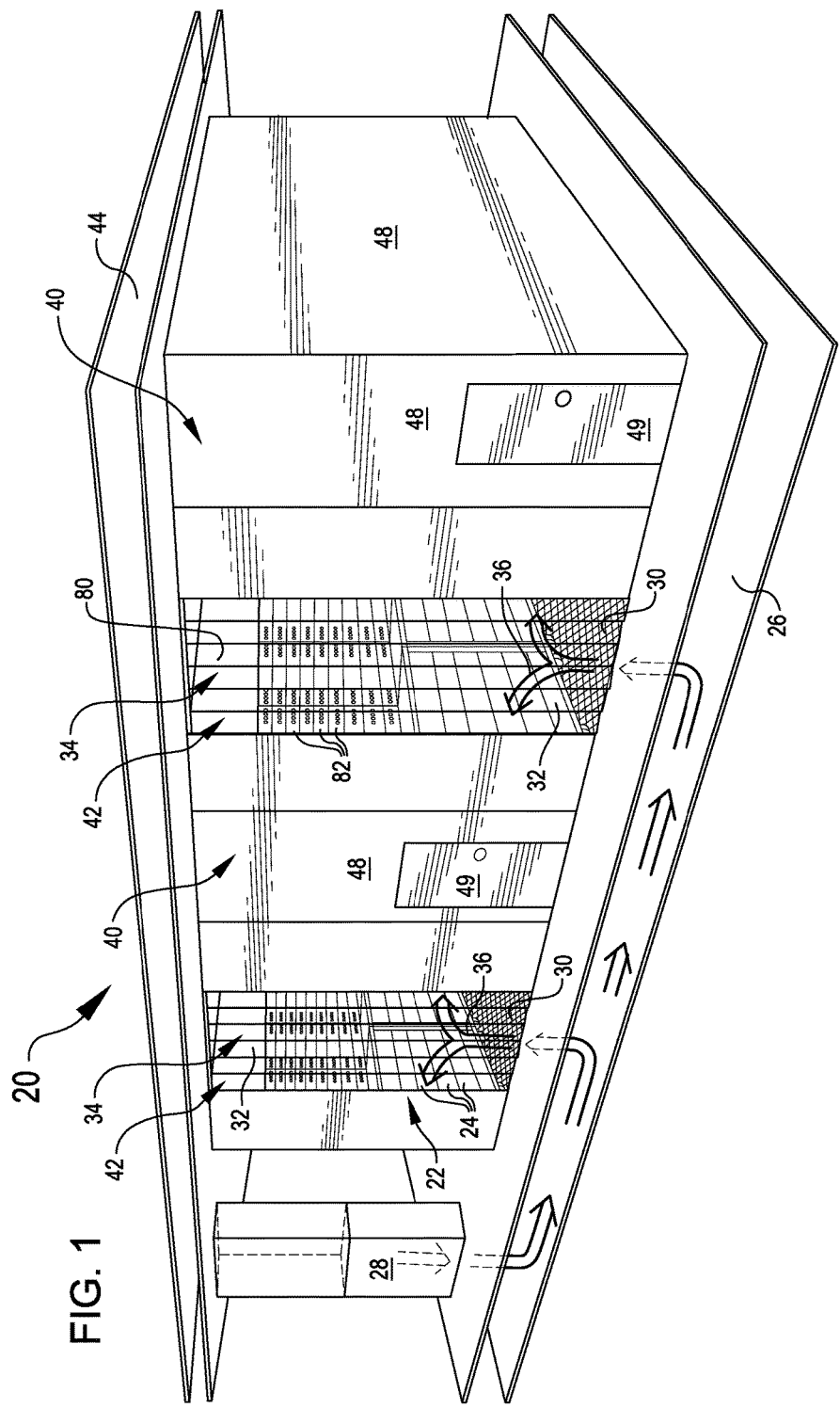
FIG. 1 is a perspective view of a datacenter incorporating an aisle containment system in accordance with embodiments.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Embodiments herein are directed to aisle containment structures for a datacenter. By "aisle containment structure," we mean a structure that limits or prevents the flow or leakage of heat into or out of an aisle (e.g., a hot aisle) in a datacenter to other parts of the data center (e.g., a cold aisle or other areas of the datacenter).

The described aisle containment structures herein are designed for hot aisle containment. However, although structures described herein are described for us for hot aisle containment, the structures can also be modified to be used for cold aisle containment.

In embodiments, the aisle containment structures form separations between one or more hot and/or cold aisles of a datacenter and other parts of the datacenter. The cold aisle or aisles are used for providing cool air for the servers and/or network hardware and for access by workers or administrators. The hot aisle or aisles receive heat exhausted from servers and/or networking hardware within the datacenter. This heat is exhausted out of the datacenter by fans and/or natural convention currents that occur in the datacenter.

To aid in air flow, computing devices are arranged so that they draw air from a cold aisle and exhaust air into a hot aisle. For example, servers are mounted in the datacenter so that a front portion, including intake vents for cooling, faces and is exposed to a cold aisle of the datacenter. A rear portion, including an exhaust fan, faces a hot aisle of the datacenter. In this manner, the server is cooled by drawing cold air from the cold aisle and the air that is heated by the server is exhausted into the hot aisle. The servers or racks for the servers can be mounted so that they extend through a structure that separates a cold aisle and a hot aisle.

In a similar manner, networking hardware can be mounted so that air intake is exposed to the cold aisle, with exhaust fans exposed to a hot aisle. Because typical networking hardware includes exhaust on a side and intake on an opposite side, the networking hardware racks are turned sideways so that the intake is exposed to the cold aisle for drawing cold air, and the exhaust side is exposed to the hot aisle, permitting hot air from the networking hardware to blow into the hot aisle.

In operation, the cooling fans of the networking hardware draw cool air from a cold aisle and exhaust hot air into a hot aisle. Similarly, the fans for the servers draw air from a cold aisle into a hot aisle. Thus, the standard cooling structures supplied for servers and networking hardware provide air flow from the cold aisles, through the equipment, and into the hot aisles.

The hot air in the hot aisles, via natural convection currents, flows to the top of the datacenter, and can be vented out of the datacenter. Cool air can be provided to the cold aisles by drawing air from outside the datacenter into the cold aisle, and/or from conditioned air being supplied to the cold aisle, for example from chillers. Fans may be provided to enhance convention flow.

Aisle containment structures herein utilize structural hardware pieces to fit around and/or against a server rack or a network hardware rack to contain hot air exiting the back of the server or hardware rack. Similarly, as described above, the structures can be used to contain air on at a cold aisle side of the racks. As used herein "server rack" is utilized to mean either a server rack or a network hardware rack, to avoid having to repeat both throughout the description. As described above, network racks are typically turned sideways, and may require some spacing between network hardware racks for technician access, whereas servers exhaust out a back exhaust fan, and thus server racks can be installed immediately adjacent to one another. The differentiation in these two structures can require some alterations to the aisle containment structures below, but in general, embodiments herein can utilize the same structure for hot aisle containment for a server rack as for a network hardware rack.

In embodiments, a hot aisle containment structure includes vertical rails that fit against back edges of rear rails for a server rack. Because the server rack is typically mounted on casters, the server rack can be pressed against the vertical rails of the hot aisle containment structure. To aid in ensuring that the rear rails of the server racks are sealed against the vertical rails, a front side of the vertical rails can include foam or other compressible and/or deformable structure to allow an airtight fit. As an example, high density rubber foam could be used on the front face of the vertical rails. The front face of one vertical rail can contact two adjacent server racks, limiting heat loss at the juncture of two racks and limiting the number of vertical rails that are needed for the aisle containment structure.

In embodiments, the vertical rails are movable horizontally so as to properly align with the rear rails of the server racks. As an example, the vertical rails can be slidably mounted on one or more horizontal rails. For example, a bottom rail and top rail can be provided for slidingly supporting the vertical rails. These rails can be arranged, for example, perpendicular to a back of a line of server racks, along a hot aisle of a datacenter. Horizontal movement of the vertical rails permits server racks of different widths to be accommodated.

Panels can be provided that extend from the top of the server rack to a top of the associated aisle, for example to a hot air plenum for the data center. A single panel can be provided for this purpose. However, in embodiments, a longer top panel is provided that extends over multiple server racks, and filler plates are provided for filling the space between the top panel and the top of each of the individual server racks. These filler plates can be mounted between adjacent vertical rails of the aisle containment structure. The filler plates can be short in height, and the number of filler plates used between the top panel and the top of an individual server rack is based upon the height of the server rack. Thus, racks of different heights can be accommodated. In addition, in embodiments, the filler plates include structures that allow mounting for various spacings between vertical rails. In this manner, a single size filler plate can be used for server racks having various widths.

In embodiments, the top panel extends from a top of the aisle to a top horizontal rail for the vertical rails, and the filler plates fill spaces between each pair of adjacent vertical rails. In this manner, a solid wall can be built between the top of the aisle to the tops of the server racks. One or more filler plates can also be used at the bottom of a server rack to cover any air gap that may exist there.

Vertical filler panels can be provided for filling spaces at the end of hot air aisles or between server racks. For example, in a situation where the aisle containment structure is utilized for network hardware racks, the vertical filler panels can be positioned between the network hardware racks so that the network hardware racks can be spaced a sufficient amount to permit a worker to access the network hardware racks.

When the aisle containment structure is in place, a solid wall is formed, with only the backs of the server racks exposed. Heat loss through the wall and into other parts of the datacenter is eliminated or minimized.

Referring now to the drawings, in which like reference numerals represent like elements throughout the several views, FIG. 1 shows a datacenter 20 in accordance with embodiments. The datacenter 20 includes several server racks 22 (FIG. 2) having servers 24 mounted therein. Although the servers 24 are diagrammatically shown as rectangles in the drawings, the servers may fill only portions of the rack, as is known. As described above, the server racks 22 may alternatively include network hardware equipment, not shown.

The datacenter 20 includes a cooling flow defining hot and cold aisles, as described above. In embodiments shown in the drawings, a cold air plenum 26 is attached to a cold air supply 28, which may be, for example, chillers, air conditioning, outside air venting, and/or other cool air supply. Air from the cold air plenum 26 flows through vents 30 in the floor of the datacenter 20. The air that flows through the vent 30 flows into a cold aisle 34 for the datacenter. In embodiments, chilled air in the cold aisle 34 can be contained by a cold air containment system, which may be, for example, air curtains 32. The cold air containment system (e.g., the curtains 32) prevents flow of the chilled air out of the cold aisle 34. As shown by the arrows 36, cold air from the cold air plenum 26 flows out of the vents 30 and into the server racks 22. This flow may be provided, for example, by the fans that are provided on the servers 24 or other network hardware equipment, as described above.

Figure 2:
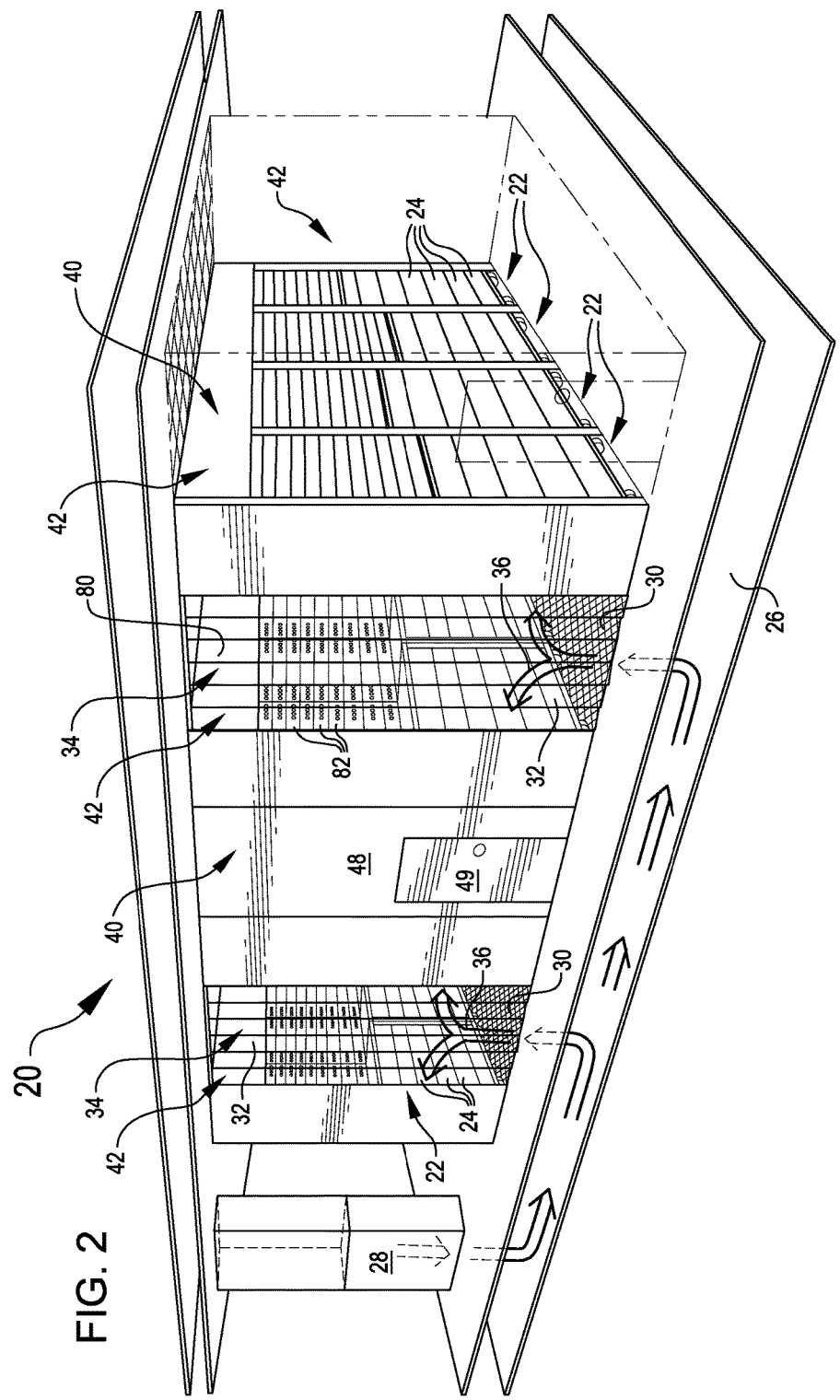
FIG. 2 is a perspective view of the datacenter of FIG. 1, with parts removed to show detail.

Hot aisles 40 are also provided in the datacenter 20. In FIGS. 1 and 2, the hot aisles 40 are enclosed structures, and part of the wall for the far right hot aisle in FIG. 2 is removed to show detail. As described above, these hot aisles 40 are isolated from the cold aisles 34 by the server racks 22 and the cold air containment system, in the example shown, the air curtains 32. In addition, in accordance with embodiments, a hot aisle containment structure 42 is provided for containing the hot air in the hot aisle and directing that air to a hot air plenum 44 in the ceiling of the datacenter 20.

The hot aisle containment structure 42 includes structures that are assembled to seal the area around the back end of the server racks 22 in the datacenter 20. The aisle containment structure 42 prevents the flow of hot air exhausting from the servers 24 back toward the cold aisle 34 or other parts of the datacenter 20. In embodiments, the hot aisle is enclosed by additional structures, such as walls 48 at the ends of the hot aisle. As shown in FIG. 1, such walls can enclose one side of a hot aisle 40 at the end of the datacenter 20. Doors 49 can be provided for access into the hot aisle 40.

Figure 3:
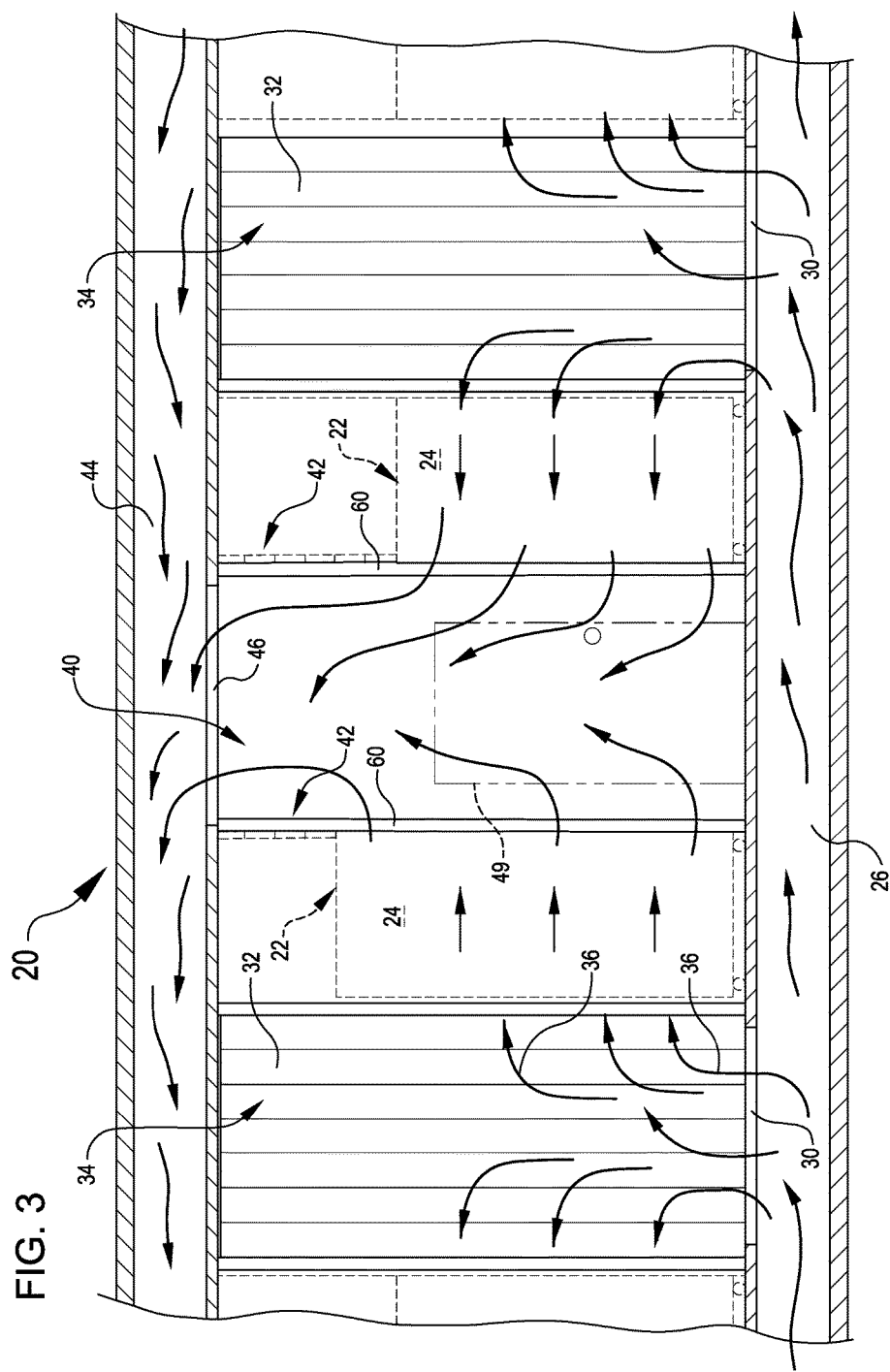
FIG. 3 is a diagrammatic representation of air flow through the datacenter of FIG. 1.

FIG. 3 is a diagrammatic representation of air flow in the datacenter 20 in accordance with embodiments. As can be seen, air flows from the cold air plenum 26, up through the grates 30 and into the cold aisles 34. The chilled air is drawn through the servers 24 in the server racks 22 and is exhausted by the servers into the hot aisle 40. The air is heated as it cools the servers 24, and thus is warm or hot when it enters the hot aisle 40. The heated air then exits the hot air aisle 40 and flows through vents 46 into the hot air plenum 44. The hot aisle containment structure 42 prevents or limits the flow of heated air back into the cold aisles 34 or into other parts of the datacenter 20.

Figure 4:
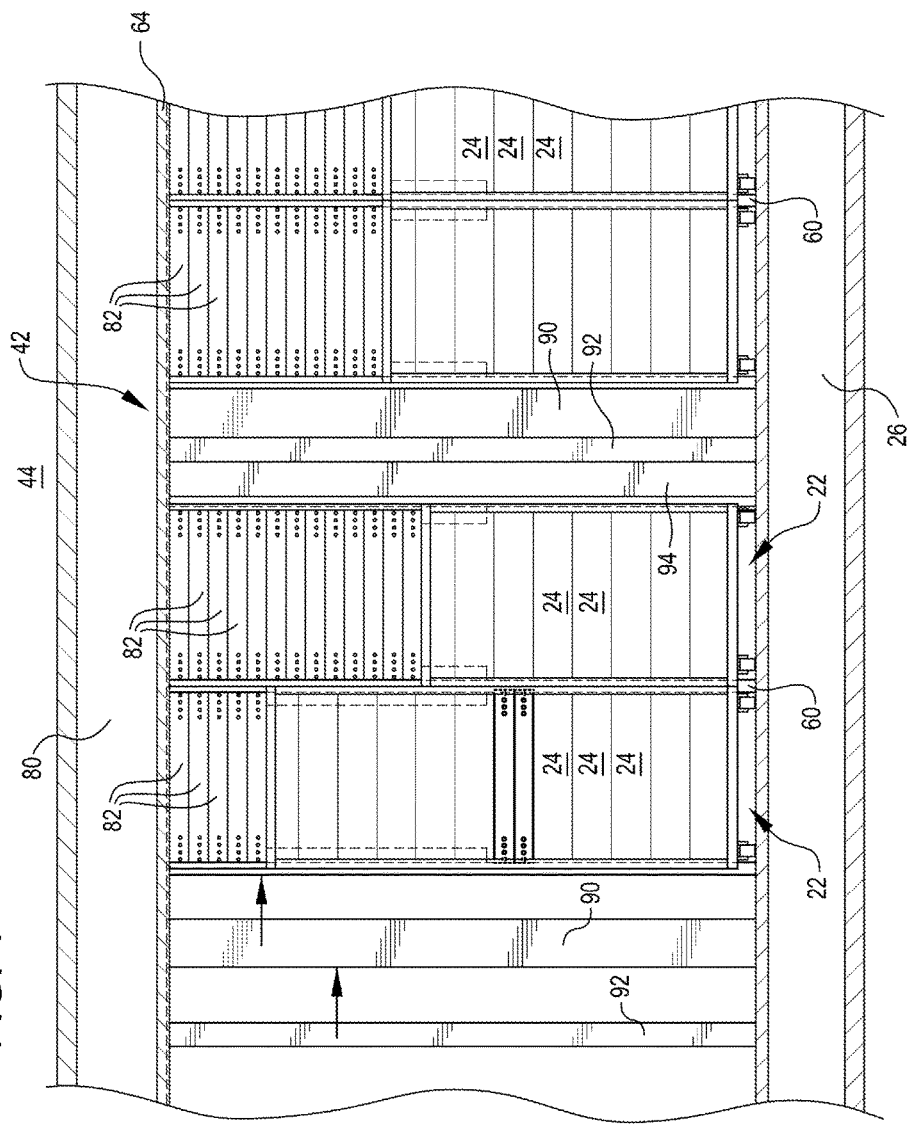
FIG. 4 is a front view of server racks installed against an aisle containment system in accordance with embodiments.
Figure 5:
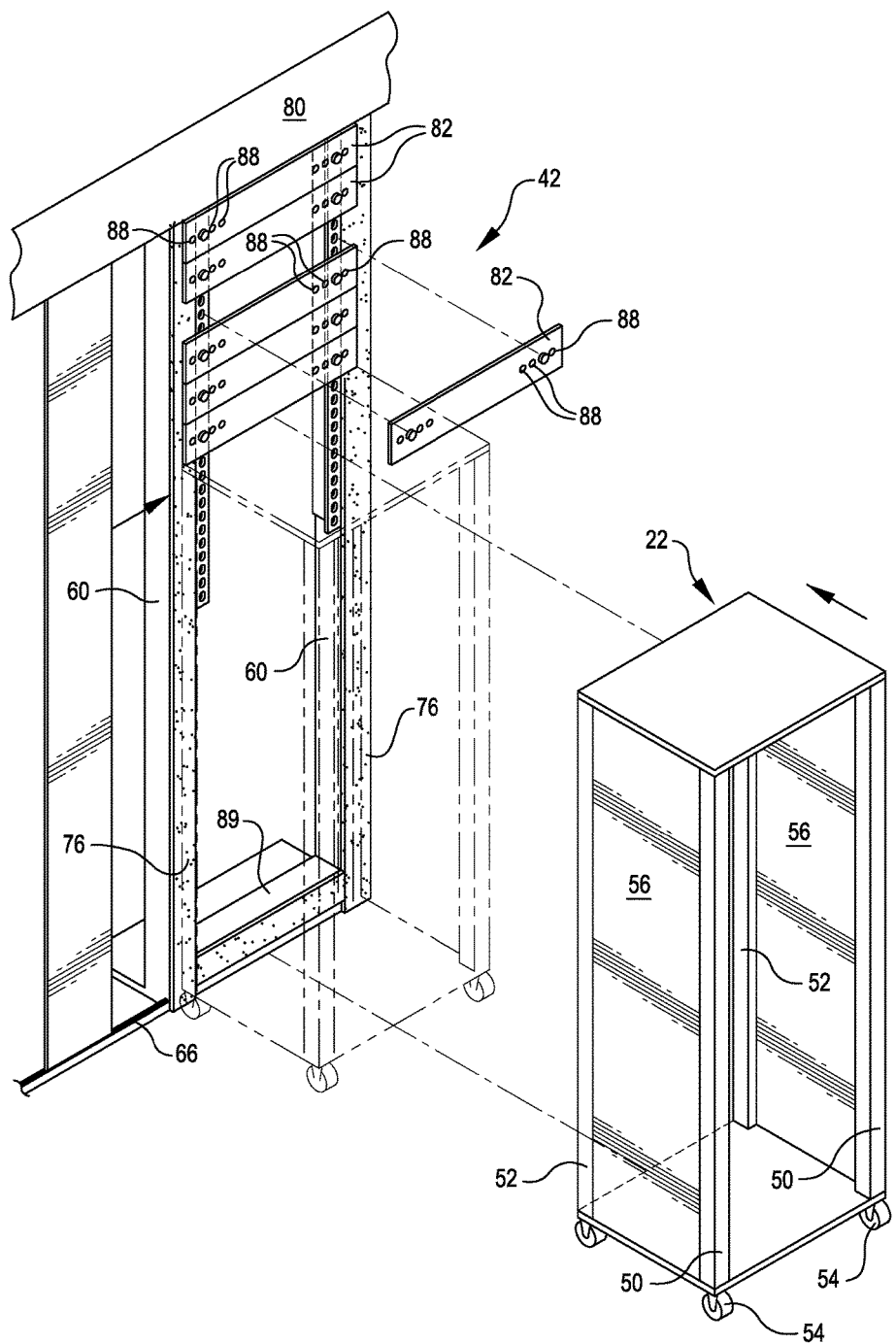
FIG. 5 is an exploded perspective view of portions of the aisle containment system of FIG. 4.

FIG. 4 shows a front view of server racks 22 installed in the hot aisle 40 against the hot aisle containment structure 42 in accordance with embodiments. The server rack 22 shown in FIG. 2 is a standard server rack utilized in many prior art datacenters. As best shown in FIG. 5, the server rack 22 includes front vertical rails 50 and rear vertical rails 52, which form a rectangular, vertical tower structure for the server rack. The server rack 22 shown in the drawings includes caster wheels 54. The server racks 22 as shown in FIG. 5 include side panels 56, which help to contain air exhausted by the servers 24. However, embodiments can be used that do not include the side panels 56.

In embodiments, as is known the art, the server rack 22 is structured such that the servers 24 fill openings in the server rack, and the rest of the server rack is enclosed. Thus, air exhausted by the servers typically cannot flow back through the server rack and into the cold aisle 34. The server rack 22 can include plates (not shown, but known) to fit over front openings in the server rack in positions where servers are not in place. The servers may not be in place because they are not needed, or because the servers are being provisioned, maintained, or have yet to be installed, as examples.

As can be seen in FIG. 5, the hot aisle containment structure 42 includes vertical rails 60 that, in accordance with embodiments, are horizontally movable to positions within the datacenter 20. In embodiments, this horizontal movement is along in axis that is parallel with the back edge of the server racks 22 in the hot aisle 40. That is, along the length of the hot aisle 40. However, if desired, the vertical rails 60 can be moved toward and away from the server racks 22.

In an embodiment where the vertical rails 60 are movable along an axis that is parallel with the back edge of the server racks 22, one or more of the top rail and a bottom rail can be used for providing sliding movement of the vertical rails 60. In embodiments shown in FIG. 5, a bottom rail 64 and a top rail 66 are provided that slidingly receive the bottom and top of the vertical rails 60, respectively. To this end, the bottom and top rails 64, 66 may include slots that receive rollers on the ends of the vertical rails, may include rollers for receiving the ends of the vertical rails 60, or may otherwise be structured so as to provide sliding movement of the vertical rails 60 along the length of the bottom and top rails 64, 66. If desired, one or more vertical rails 60 can be fixed so that the rails do not slide.

As an example, FIG. 7 shows an embodiment of how the vertical rails 60 can be slidingly mounted to the bottom and top rails 64, 66. In this embodiment, the top of the vertical rail 60 includes a roller 70 that fits into a slot 72 in the top rail 66. The bottom of the vertical rail 60 fits into a groove 74 in the bottom rail 64.

In embodiments, the bottom rail 64 is mounted to a floor of the datacenter 20. The bottom rail 64 can be directly bolted to the floor, or may be spaced from the floor as desired or as needed for leveling. The top rail 66 can be connected to a ceiling of the datacenter 20, or can be connected to the floor of the datacenter. In embodiments, the top rail 66 is supported by vertical supports (e.g., poles at opposite ends, not shown) that extend upward from the bottom rail 64. As another alternative, the top rails 66 can be supported at two ends, for example, by being connected to the walls 48.

In embodiments, as shown in FIG. 6, the vertical rails 60 are compressible at a front face that engages the server racks 22. To provide this function, any material that is compressible can be used. Deformable and compressible materials both provide this function. For example, rubber, foam, or another compressible or deformable material can be used on a front face of the vertical rails 60. In FIG. 6, a high density rubber foam strip 76 is used on the front face of the vertical rail, but another material could be used. In embodiments, the strip 76 is a UL rated fire retardant material.

When a server rack 22 is installed in the datacenter 20, it is pressed into engagement with a pair of vertical rails 60 so that one of the rear rails 52 of the server rack engages one vertical rail 60, and the other rear rail of the server rack engages the other vertical rail. As shown in FIGS. 4 and 5, the rear rail 52 of a server rack 22 is positioned to one side of the compressible front face on a vertical rail 60. A second server rack 22 may include a rear rail 52 that engages the opposite side of the vertical rail 60. In this manner, a single vertical rail 60 can engage two server racks 22. Likewise, a vertical rail 60 is used on the opposite side of the server rack 22 and engages that the rear rail 52 on that server rack and the rear rail on the adjacent server rack. In alternative embodiments, vertical rails 60 can be positioned adjacent to each other and a single vertical rail 60 can be utilized for each rear rail 52 of each server rack 22.

The compressible nature of the foam strip 76 on the front edge of the vertical rails 60 provides an airtight engagement of the rear rails 52 on the server racks 22 with the vertical rails 60. By engaging the rear rails 52 of two adjacent server racks 22, there is no air gap between server racks. The compressible nature of the foam strip 76 permits sealed engagement of the server racks 22 with the vertical rails 60, and can account for server racks being mounted on uneven floor and being at a slight tilt. In addition, the side panels 56 prevent escape of hot air out of the sides of the server rack 22. Thus, hot air generated by the servers 24 and exhausted by the fans on the servers is contained in a horizontal direction by the side panels 56 of the server racks 22 and the contact of the rear rails of the server racks with the vertical rails 60. That hot air must exit out the back of the server rack 22 and through the vertical rails 60.

Typically, server racks, such as the server racks 22, are of a height that does not reach the ceiling of the datacenter 20. To contain air between the top of the server racks 22 and the ceiling of the datacenter, a panel structure can be provided. In embodiments, this panel structure can be a single panel that extends between a ceiling of the datacenter 20 and the tops of the server racks 22. However, in accordance with embodiments, and as is shown in FIG. 5, multiple panels can be used for this function.

In the embodiment shown in FIG. 5, a top panel 80 is mounted downward from the hot air plenum 44 of the datacenter 20. The top panel 80 can be of any height, but in embodiments, is a height that is no more than a distance between the hot plenum 44 and the tallest server rack 22 that would be used in the datacenter 20. That is, the top panel 80 extends down to a level that is no lower than a height of a tallest server rack 22 that would be used in the datacenter. The top panel 80 can extend over multiple server racks 22. In embodiments, the top panel 80 is an elongate panel that extends between the ceiling of the datacenter 20 and the top rail 66.

To fill the space between the top panel 80 and the top of the individual server racks 22, filler plates 82 can be used. The filler plates 82 could be formed of any material, but in embodiments, is a UL retardant material, such as aluminum or sheet metal. The filler plates 82 can be of any height and all filler plates do not necessarily have to be the same height. Thus, the number of filler plates 82 that are used depends upon the height of the filler plates and the space between the top panel 80 and the top of the particular server rack 22. The filler plates 82 fill the space between adjacent vertical rails 60. To permit the filler plates 82 to fit multiple different heights of servers, the filler plates 82 can be short in height, for example 3 inches in height.

After the server rack 22 has been positioned against the pair of vertical rails 60, a sufficient number of filler plates 22 are mounted between the top panel 80 and the top of the server rack. A mounting structure is provided for attachment of the filler plates 82 to the vertical rails 60. In the embodiment shown in the drawings, slotted rails 84 are provided for this purpose. However, the filler plates 82 can be attached directly to the vertical rails 60 or may be connected to the vertical rails in any other manner.

To accommodate different widths between the vertical rails 60, the filler plates 82 shown in the drawing include multiple punch outs 88. An installer can select the appropriate punch out 88 for a given spacing of the vertical rails 60. Other structures can be used to provide variable spacing and/or filler plates 82 can be provided with different widths. However, by providing variable width connections, a standard size can be used for multiple widths of server racks 22.

If desired, the filler plates 82 can be positioned behind open slots in the server rack 22 to prevent flow of air into or out of those open slots. In addition, filler plates 82 can be positioned below a bottom edge of the server rack to a floor for the datacenter 20. This feature may be desired, for example, where the server rack 22 includes caster wheels that space the server rack from the floor. As an alternative, as shown in FIG. 5, a block 89 can be mounted at the floor of the datacenter and that engages a bottom of a server rack 22. This block 89 can also include a compressible material for engaging a bottom rail of the server rack 22, such as the high density rubber foam strip 76 used for the front face of the vertical rails 60. In embodiments, the block 89 is formed of a UL rated fire retardant material.

The top plate 80 and the filler plates 82 contain hot air in the hot aisle 80 in the area above the server racks 22 and below the hot air plenum 44. This feature keeps hot air contained above the server racks 22.

To install a server rack 22, a pair of vertical rails 60 are aligned with a back edge of the two rear rails 56 of the server rack 22. This can require horizontal movement of one or both of the vertical rails 60 along the bottom and top rails 64, 66. The server rack 22 is then pushed, for example on the casters 54, into position against the foam strips 76 on the vertical rails 60. The server rack 22 is pressed into position against the vertical rails 60, compressing the foam strip 76 on the front face of the vertical rails. The caster wheels 54 can be locked in place when the foam strip 76 is compressed. The installer then mounts filler plates 82 in the space between the two vertical rails 60 until the space is filled between the top of the server rack 22 and the top panel 80. Also, as described above, if desired, additional plates can be mounted behind unused sections of the server rack 22 and/or below the server rack.

An adjacent server rack 22 can then be installed using a third vertical rail 60. The adjacent server rack includes one rear rail 52 that engages the vertical rail 60 that contacts the first-installed server rack, and another rear rail that engages the third vertical rail 60. Filler plates 82 are then installed above that server rack to the top panel 80. This process continues until a row of server racks 82 are installed along the hot aisle 40.

In embodiments, server racks 22 may be not be utilized along the entire length of the hot aisle 80. As an example, as described above, if network hardware devices are mounted in the server racks 22, then spacing may be desired between the racks to provide technician access to the network hardware. As another example, spacing may be desired between the end of the hot aisle 40 and a first server rack 22, and perhaps at other locations along the length of the hot aisle. For such situations, vertical filler panels 90, 92 (FIG. 4) can be provided that are also mountable along and slidable on the bottom and top rails 64, 66. In the embodiment shown in the drawing, the vertical filler panels 90, 92 are large and small, respectively, but vertical filler panels can be of any width. The vertical filler panels 90, 92 can be used to fill space between server racks 22 or at the ends of the hot aisles 40 so as to fully contain the hot aisle. Theses filler plates 90, 92 can be pressed against the vertical rails 60 to seal open areas of the containment structure 42. If desired, although not shown, foam strips, such as the foam strip 76, can be used to seal the filler plates 90, 92 against each other, against a wall, and/or against a vertical rail 60.

In embodiments, the filler plates 82 are a standard size (e.g., 3 inches tall and 25 inches wide) and the filler plates 90, 92 are one, two, or a fixed number of standard sizes so that a datacenter installer can stock a limited number of parts for installation of server racks. Alternatively, panels can be cut to desired sizes on site or can be ordered for a particular installation. The filler panels can be a height to extend between the top and bottom rails 66, 64.

To complete the enclosure of the hot aisle containment structure 42, end walls 48 (FIG. 1) can be provided at the ends of the hot aisle 40. One or both of the end walls 48 can include a door 49 for access into the hot aisle 40.

With the end walls 48, the vertical rails 60, the top panels 80, and the filler plates 82, the hot aisle 40 is structurally separated from other portions of the datacenter 20. Thus, hot air in the hot aisle 80 is limited to flow out of the hot air plenum 44. By structurally isolating air within the hot aisle 40, air does not escape and warm the chilled air in the cold aisle 34. Thus, cool air that is provided to the cold aisle can be limited, thus increasing the efficiency of the datacenter 20, and allowing the datacenter operator to increase power usage effectiveness (PUE) of datacenter.

The hot aisle containment system 42 also provides solutions for server racks 22 that have height and width differences. There are several hot containment systems on the market today, but they try to capture the entire market share by designing solutions with wide spectrum of applications around height/widths. Such systems create additional moving parts for the containment itself, and costs increase in manufacturing additional parts. In addition, ultimately there are physical gaps in the design which creates air leakage thus providing to be less effective in containment. Another down fall to this is that the design is built from "one off" materials which makes sourcing harder, creates longer lead time, and has importation challenges. The hot aisle containment system 20, in contrast, can handle multiple width and height server racks 22, while still utilizing common components. In addition, because two server racks 22 engage a single vertical rail 60, spaces between the racks do not become an issue.

To mount a similar structure in a cold aisle, the vertical rails 60 can be aligned against the front rails 50 of the server racks, and the aisle containment structure 42 would be built at this side of the server racks. This structure would contain the chilled air in the cold aisle 34 of the datacenter 20.

The specification and drawings are, accordingly, to be regarded in an illustrative rather than a restrictive sense. It will, however, be evident that various modifications and changes may be made thereunto without departing from the broader spirit and scope of the invention as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions and equivalents falling within the spirit and scope of the invention, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Preferred embodiments of this disclosure are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

All references, including publications, patent applications and patents, cited herein are hereby incorporated by reference to the same extent as if each reference were individually and specifically indicated to be incorporated by reference and were set forth in its entirety herein.

What is claimed is:

1. A datacenter, comprising:
a hot aisle and a cold aisle defining a plane separating a hot side and a cold side, with the hot side being positioned on one side of the plane and the cold side being positioned on an opposite side of the plane;
a first rail and a second rail mounted at the plane, each of the first and second rails being oriented in a first direction and at least one of the first and second rails being movable in a second direction orthogonal to the first direction;
one or more filler plates mounted between the first and second rails and between the hot side and the cold side; and
a rack having one or more electronic components and one or more openings adjacent the one or more electronic components to engage the first and second rails, such that the one or more openings in the rack are blocked by the one or more filler plates.

2. The datacenter of claim 1, wherein the first and second rails are oriented vertically, and wherein at least one of the first and second rails is movable horizontally.

3. The datacenter of claim 1, wherein the one or more filler plates form a substantially airtight wall between the hot side and the cold side, such that substantially all airflow between the hot side and the cold side passes through the one or more electronic components.

4. The datacenter of claim 1, wherein the rack comprises a plurality of electronic components and a plurality of openings, and wherein the rack is aligned to engage the first and second rails such that each opening of the plurality of openings adjacent the plurality of electronic components is blocked by a filler plate of the one or more filler plates.

5. The datacenter of claim 1, wherein an open space defining a boundary between the hot side and cold side is larger than an extent of the rack, and wherein a portion of the open space beyond the extent of the rack is blocked using one or more of the filler plates.

6. The datacenter of claim 1, wherein the rack is engaged with the vertical rails and one or more filler plates.

7. The datacenter of claim 6, wherein the first and second rails each comprise a deformable structure, and wherein the deformable structure is deformed by the rack when the rack is moved to engage with the vertical rails.

8. An apparatus, comprising: first and second rails mounted to a frame, each of the first and second rails being oriented in a first direction and at least one of the first and second rails being movably mounted in a second direction orthogonal to the first direction with respect to the other of the first and second rails, the first and second rails defining a plane therethrough, with a hot side being positioned on one side of the plane and a cold side being positioned on an opposite side of the plane; and one or more filler plates mounted between the first and second rails and between the hot side and the cold side such that one or more openings are created between the one or more filler plates, wherein the one or more filler plates are positioned such that the one or more openings align with one or more electronic components, such that a flow of air can flow from the cold side to the hot side through the one or more electronic components.

9. The apparatus of claim 8, wherein the first and second rails are oriented vertically, and wherein at least one of the first and second rails is movable horizontally.

10. The apparatus of claim 8, wherein the one or more filler plates are positioned to block at least a portion of the flow of air flowing from the cold side to the hot side.

11. The apparatus of claim 10, further comprising one or more fans configured to draw the flow of air from the cold side through the one or more electronic components.

12. The apparatus of claim 8, further comprising a hot aisle positioned at the hot side and a cold aisle positioned at the cold side, and an exhaust in the hot aisle that draws air therefrom by convection, such that the apparatus is configured to draw the air from the cold side through the one or more electronic components via convection.

13. The apparatus of claim 8, wherein
the one or more electronic components are mounted in a movable rack that is movable to abut the first and second rails; and
the one or more filler plates are slidably aligned with one or more voids between the one or more electronic components so that, when the rack is moved to abut the first and second rails, the voids align with the filler plates.

14. A system for cooling electronic components, comprising:
a first rail and a second rail, each of the first and second rails being oriented in a first direction and at least one of the first and second rails being movably mounted in a second direction orthogonal to the first direction with respect to the other of the first and second rails, the first and second rails defining a plane therethrough, with a hot side being positioned on one side of the plane and a cold side being positioned on an opposite side of the plane; and
at least two filler plates mounted between the first and second rails, positioned to define one or more open spaces between the filler plates and to at least partly obstruct a flow of air between the cold side and the hot side between the one or more open spaces.

15. The system of claim 14, further comprising:
a rack containing one or more electronic components and one or more voids adjacent the one or more electronic components, wherein:
the filler plates are movable to match the one or more voids and operable to obstruct the flow of air through the one or more voids; and
the rack is positioned adjacent the first and second rails such that one or more electronic components are aligned with the one or more open spaces.

16. The system of claim 15, wherein:
the first and second rails comprise a deformable material; and
the rack containing the one or more electronic components deforms the deformable material to form a seal.

17. The system of claim 14, wherein:
the filler plates are sized to match a void between two electronic components in an electronic component rack.

18. The system of claim 17, further comprising:
a plurality of the filler plates positioned to obstruct the flow of air between the hot and cold side beyond an extent of the one or more electronic components.

19. The system of claim 14, further comprising:
a hot aisle positioned on the hot side of the first and second rails;
a cold aisle positioned on the cold side of the first and second rails; and
a flow of cold air originating from the cold side and passing between the first and second rails to the hot side.

20. The system of claim 14, further comprising:
a rack containing one or more electronic components and one or more voids adjacent the one or more electronic components, the rack positioned adjacent the first and second rails, wherein the filler plates are positioned to block the flow of air from passing through at least one of the one or more voids, so as to increase a proportion of the flow of air flowing through the one or more electronic components.

\* \* \* \* \*